US006481558B1

(12) United States Patent
Bonora et al.

(10) Patent No.: US 6,481,558 B1
(45) Date of Patent: Nov. 19, 2002

(54) INTEGRATED LOAD PORT-CONVEYOR TRANSFER SYSTEM

(75) Inventors: Anthony C. Bonora, Menlo Park; Richard H. Gould, Fremont; Jeffrey R. Kerr, Redwood City, all of CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/467,093

(22) Filed: Dec. 10, 1999

Related U.S. Application Data

(60) Provisional application No. 60/112,947, filed on Dec. 18, 1998.

(51) Int. Cl.$^7$ .............................................. B65G 37/00
(52) U.S. Cl. ................................ 198/346.2; 198/346.1; 198/341.05
(58) Field of Search ............................. 198/341.05, 349, 198/345, 781, 472, 344, 346.1, 572, 460, 577, 346.2; 414/940

(56) References Cited

U.S. PATENT DOCUMENTS

| | | | | |
|---|---|---|---|---|
| 3,746,148 A | * | 7/1973 | Hilger et al. ................ 198/219 |
| 3,840,110 A | * | 10/1974 | Molt et al. ................... 198/127 |
| 3,927,620 A | * | 12/1975 | Clapham ..................... 104/148 |
| 3,976,330 A | * | 8/1976 | Babinski et al. ............. 302/2 R |
| 4,014,428 A | * | 3/1977 | Ossbahr ........................ 198/345 |
| 4,093,084 A | * | 6/1978 | Ringer ..................... 214/11 R |
| 4,305,335 A | * | 12/1981 | Plugge ...................... 104/172 B |
| 4,453,627 A | * | 6/1984 | Wilkins ........................ 198/781 |
| 4,461,382 A | * | 7/1984 | Hoover et al. .............. 198/781 |
| 4,513,854 A | * | 4/1985 | Prodet et al. ................ 198/472 |
| 4,515,264 A | * | 5/1985 | Sticht .......................... 198/344 |
| 4,530,287 A | * | 7/1985 | Sticht .......................... 104/168 |
| 4,534,462 A | * | 8/1985 | Hoover et al. .............. 198/781 |
| 4,572,358 A | * | 2/1986 | Swain .......................... 198/781 |
| 4,619,205 A | * | 10/1986 | Sticht .......................... 104/168 |
| 4,793,262 A | * | 12/1988 | Horn ........................... 104/168 |
| 4,805,759 A | * | 2/1989 | Rochet et al. ............. 198/346.1 |

(List continued on next page.)

FOREIGN PATENT DOCUMENTS

EP 0 674 069 A1 3/1994

Primary Examiner—Christopher P. Ellis
Assistant Examiner—Rashmi Sharma
(74) Attorney, Agent, or Firm—O'Melveny & Myers LLP

(57) ABSTRACT

A transfer system and method for moving an article between a conveyor and a workstation. The transfer system includes an elevator system having a lift device configured to engage the article carried by a conveyor and raise the article above the conveyor. The lift device is movable between a stand-by position with the lift device positioned for the movement of articles past the lift device along the conveyor, and an actuated position with the lift device holding the article above the conveyor. The transfer system also includes a support assembly for supporting the article vicinal a workstation. The support assembly including a shelf for retaining the article at the workstation and a displacement mechanism for moving the shelf between the conveyor and the lift device. The method includes moving a support to engage the article and lift the article above the conveyor, extending a load port shelf to the conveyor and inserting the shelf between the article and the conveyor. After the shelf is extended, the method includes moving the support to deposit the article onto the shelf, and after the step of moving the support, the method includes retracting the shelf to the load port.

9 Claims, 16 Drawing Sheets

U.S. PATENT DOCUMENTS

| | | | | |
|---|---|---|---|---|
| 4,826,360 A | * | 5/1989 | Iwasawa et al. | 406/51 |
| 4,845,843 A | * | 7/1989 | Babcock | 29/829 |
| 4,926,753 A | * | 5/1990 | Weiss | 104/88 |
| 4,940,000 A | * | 7/1990 | Horvath et al. | 104/295 |
| 4,974,519 A | * | 12/1990 | Miletto | 104/165 |
| 5,086,910 A | * | 2/1992 | Terpstra | 198/572 |
| 5,129,507 A | * | 7/1992 | Maeda et al. | 198/781 |
| 5,213,201 A | | 5/1993 | Huber et al. | 198/781 |
| 5,285,887 A | | 2/1994 | Hall | 198/460 |
| 5,318,167 A | | 6/1994 | Bronson et al. | 198/577 |
| 5,411,358 A | | 5/1995 | Garric et al. | 414/277 |
| 5,452,801 A | | 9/1995 | Horn | 206/454 |
| 5,521,563 A | | 5/1996 | Mazzochette | 333/116 |
| 5,529,166 A | * | 6/1996 | Markin et al. | 198/349 |
| 5,533,844 A | | 7/1996 | Ekleberry | 409/159 |
| 5,673,804 A | | 10/1997 | Weiss et al. | 212/274 |

* cited by examiner

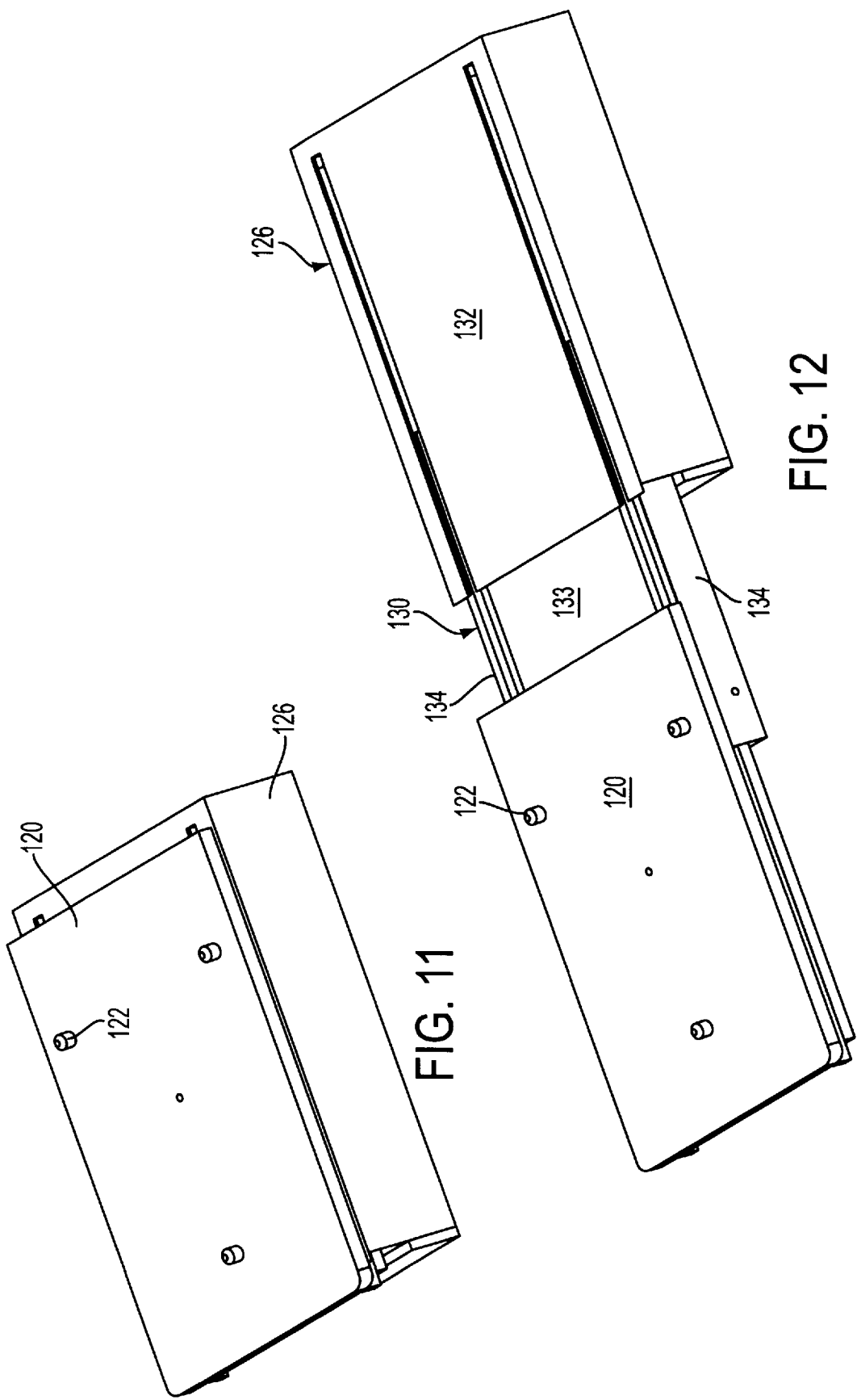

INTEGRATED LOAD PORT-CONVEYOR TRANSFER SYSTEM

CROSS REFERENCE TO RELATED APPLICATIONS

This application claims priority to U.S. provisional patent application Ser. No. 60/112,947 filed Dec. 18, 1998, the entire disclosure of which is hereby incorporated by reference.

BRIEF DESCRIPTION OF THE INVENTION

The present invention relates in general to a system for transferring articles and, more particularly, to a transfer system for moving an article between a conveyor used to transport the articles along a conveyor path and a work station.

BACKGROUND OF THE INVENTION

In various fields, delicate or valuable articles must be safely transported between work stations and the like without damaging or destroying the articles. Articles requiring careful handling include, but are not limited to, pharmaceuticals, medical systems, flat panel displays, computer hardware such as disc drive systems, modems and the like, and semiconductor wafers. The articles are often transported from work station to work station by a conveyor. In many situations, the articles must be temporarily removed from the conveyor for processing. Preferably, the operation of the conveyor is not interrupted while the article is removed from the conveyor. After the processing has been completed, the articles must then be carefully returned to the conveyor for transport to the next work station.

With many applications, the value of the articles increases after the articles are processed at each work station. For example, integrated circuits are manufactured by forming a plurality of layers on a substrate such as a semiconductor wafer. The work stations used to form integrated circuits include machines for depositing the individual layers as well as machines for cleaning and/or conditioning the substrate at various stages. With advances in technology, integrated circuits have become increasingly complex and typically include multiple layers of intricate wiring. The size of the integrated circuits has decreased, greatly increasing the number of such devices on a single wafer. As a result of the increased complexity and decreased size of the integrated circuits, the value of the semiconductor wafer increases substantially as the wafer progresses through the various processing stages. The standard size of the semiconductor wafers will increase from 200 mm to 300 mm or larger in the next few years, further increasing the number of integrated circuits which may be formed on a single wafer and therefore the value of each wafer. For articles such as semiconductor wafers, considerable care must be taken when handling the articles to reduce the risk of damaging the articles and incurring significant monetary losses.

Some articles, such as semiconductor wafers, must be retained in a clean room environment during processing to preserve the purity of the layers deposited on the wafer. The requirement of a clean room environment places additional constraints on the handling of these articles. For additional protection against contaminants, the semiconductor wafers are typically retained in sealed transport devices, such as pods as they are moved throughout the manufacturing facility to minimize any exposure to the environment outside of the processing machines. The pods are used to transport the articles along the conveyor.

The input station of the semiconductor processing machines often include a load port for the automatic removal of one or more wafers from the transport pod in a protected environment. The load port shelf may be moved a limited distance, on the order of a couple of inches, to move the pod toward and away from a load port seal at the machine entrance. This horizontal shifting of the pod is minimal and does not serve any function in the movement of the pod to the load port or the transfer of the pod between the conveyor and load port.

A system for safely and accurately moving a transport pod or other article between a conveyor and a work station is desirable. An article transfer system which may be used to move the articles without significantly disrupting the continued operation of the conveyor is also desirable. Similarly, a transfer system which may be used to support the article at the work station is desirable.

OBJECTS AND SUMMARY OF THE INVENTION

It is a primary object of the present invention to provide a system for transferring articles between a conveyor and a work station.

It is a further object of the present invention to provide a system for moving articles between a conveyor and a work station in a clean room environment.

It is another object of the present invention to provide a transfer system which may be used to automatically transfer articles between the conveyor and work station without significantly interrupting operation of the conveyor.

It is yet another object of the present invention to provide a transfer system for moving a transport pod or other container retaining one or more semiconductor wafers between a conveyor and the load port of a processing machine.

A more general object of the present invention is to provide a transfer system which may be efficiently constructed, operated and maintained.

Another object of the present invention is to provide a transfer system which is compatible with a motion axis that is already included in standard load ports.

In summary, the present invention provides a transfer system for moving an article between a conveyor and a workstation. The transfer system generally includes an elevator system and a support assembly positioned adjacent to the work station. In the illustrated application, where the work station is a semiconductor processing machine, the support assembly is preferably mounted to the machine. The elevator system includes a lift device is configured to engage the article being transported along the conveyor and raise the article above the conveyor. The lift device is movable between a stand-by position in which the lift device positioned so that articles transported by the conveyor may move past the lift device, and an actuated position with the lift device holding the article above the conveyor. The support assembly includes a shelf member or equivalent support means for retaining the article at the workstation and a displacement mechanism for moving the shelf member or equivalent support means between the conveyor and the lift device to carry the article between the conveyor and the work station.

The present invention also provides a method of moving articles between a work station and conveyor. The method includes the steps of moving a support to engage the article and lift the article from a first position to a second position above the conveyor and extending a shelf of a load port to the conveyor and inserting the shelf between the article and the conveyor. After the step of extending a shelf, the support is moved to deposit the article onto the shelf, and after the step of moving the support, the shelf is retracted to the load port.

Additional objects and features of the invention will be more readily apparent from the following detailed description and appended claims when taken in conjunction with the drawings.

BRIEF DESCRIPTION OF THE DRAWINGS

FIG. 3a is a sectional view taken substantially along line 3a—3a of FIG. 2a.

FIG. 11 is a pictorial view of the support assembly of FIG. 4, shown with the shelf in the closed position.

FIG. 12 is a pictorial view of the support assembly of FIG. 4, shown with the shelf in the extended position.

DETAILED DESCRIPTION OF THE INVENTION

Figure 1:
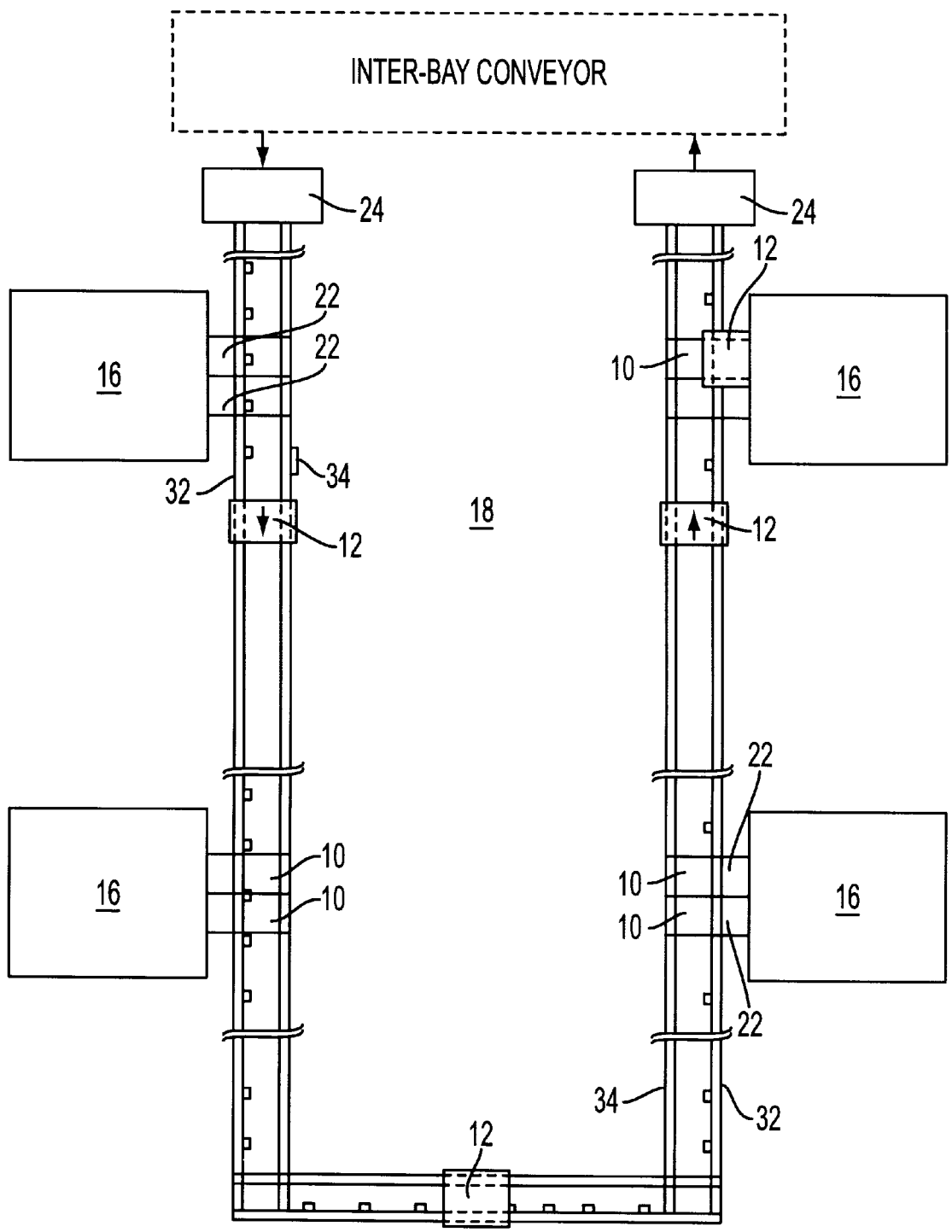
FIG. 1 is a schematic view of an example of a conveyor system incorporating a transfer system in accordance with the present invention.

Reference will now be made in detail to the preferred embodiment of the invention, which is illustrated in the accompanying figures. Turning now to the drawings, wherein like components are designated by like reference numerals throughout the various figures, attention is directed to FIGS. 1–3.

The transfer system 10 of this invention is particularly suitable for transferring one or more articles 12 between a conveyor 14 and a station 16, such as a workstation. The station 16 may be a work station or a buffer station where one or more articles may be stored while temporarily removed from the conveyor 14. It is to be understood that the station may also have other functions. In one application, described in the illustrated embodiments of the invention, the transfer system 10 is used to move transport pods or other containers housing semiconductor wafers W between a conveyor and a processing machine. However, it is to be understood that the transfer system 10 is not to be limited to semiconductor processing. Instead of wafer transport, the transfer system may be used to transfer other types of materials, particularly delicate materials where substantial care must be taken in handling the materials such as pharmaceuticals, medical systems, flat panel displays, lithography reticles, hard disk drives and other types of computer equipment, between a conveyor and a station. The term "transport device" or "transport pod" are used throughout the description for convenience; however, it is to be understood that the transfer system of this invention may be used with any article, including but not limited to transport pods, containers holding semiconductor wafers or other items, pallets, or articles which may be directly transported by the conveyor without requiring a separate transport device, and empty containers.

In the field of semiconductor processing, the manufacturing facility is typically organized into a plurality of bays each including several processing machines. FIG. 1 shows a possible example of a bay 18 with several processing machines 16 including, but not limited to, equipment for depositing films on the wafers, for cleaning and/or conditioning the wafers at various stages, and the like. As is known in the art, the entrance of the processing machine is often provided with a load port 22 where the wafers may be automatically removed from the transport pod or other container in a protected environment. As described in more detail below, the transfer system 10 of this invention deposits the transport pod on the load port 22. Once the transport pod is properly positioned at the load port, the pod is automatically opened and the wafers are extracted from the pod by robotic devices. It is to be understood that the transfer system of this invention may be used with work stations 16 which do not include a load port provided that the work station includes a shelf, surface or other support on which the article 12 may be positioned. Alternatively, the transfer system 10 may be used to support the article 12 in position at the work station in which case the article 12 would not be deposited on the work station.

The conveyor 14 moves the articles from processing machine 16 to processing machine 16. In the illustrated example, the conveyor 14 is arranged in a continuous path around the bay 18. However, in other path configurations the conveyor 14 may include one or more cross sections which may be used as a short-cut to other areas of the bay 18 or as a holding area to temporarily remove pods from the main conveyor loop without interrupting the traffic flow on the main loop. The configuration of the conveyor 14 is subject to considerable variation depending upon the constraints of a particular manufacturing facility. An inter-bay conveyor transports the pods between the bays, with stockers 24 transferring the pods between the inter-bay conveyor and the conveyor 14.

Figure 2A:
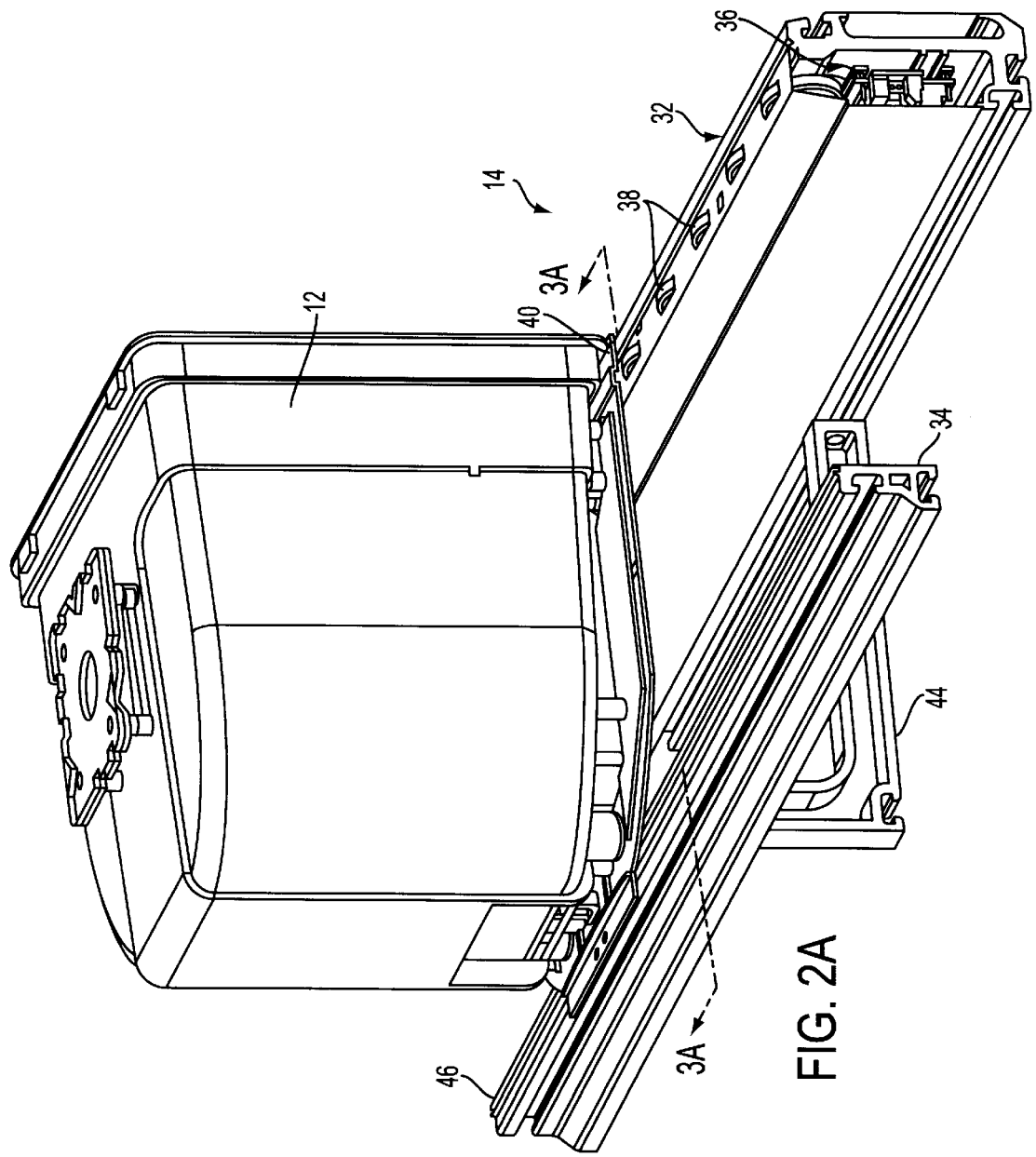
FIG. 2a is a pictorial view of a section of the conveyor system shown in FIG. 1 according to one embodiment of the present invention.

The transfer system 10 is particularly suitable for use with a conveyor system of the type shown in shown in co-pending U.S. patent application Ser. No. 09/103,479, the entire disclosure of which is incorporated herein by reference. As shown for example in FIGS. 1–3, the conveyor system 14 generally includes a pair of rails 32, 34 for supporting the transport pod as it is moved along the conveyor path. The rail 32 functions as a drive rail which propels and optionally guides the transport pod 12 along the rails 32, 34. All propulsion power for moving the pod 12 is supplied via the drive rail 32. Power may be supplied to the drive rial 12 via conventional means. Alternatively, power may be supplied to the drive rail 12 by a power bus 21 (shown in FIG. 3a). Rail 34 is an idler or support rail with a primary function of supporting the transport pod such that the pod is held in a level orientation as it is moved along the conveyor path. Optionally, the support rail 34, as opposed to the drive rail 32, may be used to guide the transport pod as it travels along the conveyor system. The conveyor system 14 also includes a transport device for moving the wafers or other materials. In this embodiment, as shown in FIGS. 2 and 3, the transport device is part of the transport pod. In other embodiments of the invention, the transport device may be part of another container or article, or the transport device may be a separate device which may be used to transport materials along the conveyor.

The drive rail 32 includes a drive system, generally designated at 36, for propelling the pod 12 along the rails 32, 34. In the illustrated embodiment of the invention, the drive system 36 includes a plurality of wheels 38 which project from the upper surface of the drive rail 34. The drive wheels 38 frictionally engage the underside of the transport pod to propel the pod along the drive rail 32. The drive system 36 also includes means for driving the wheels such as motors and belts coupled to the wheels. Preferably, the motors operate independently to provide a plurality of independently controlled drive zones such that the drive speed and direction (forward or reverse) of each zone may be independently controlled. The wheels 38 of adjacent operational zones are accelerated and decelerated at the same rate such that at the time of transfer, the speed imposed on the transport pod by the wheels in adjacent zones is synchronized at the time of transfer between the zones. As the pod is propelled along the conveyor, only the operational zone directly below a pod and one or more zones adjacent the pod are in active motion at any time. This reduces the power consumption of the system and extends the operational life of the components of the drive system 36. The drive zones below and adjacent to other pods may be held in a stationary or inactive mode, allowing a plurality of pods to accumulate in an area of the conveyor, such as before one of the processing machines 16. Preferably, the pods are located in adjacent zones when the transfer system is stopped or in the inactive mode. The operation of the drive system 36 is controlled by a control system. The control system also preferably includes one or more sensors to monitor the progress of the pods along the conveyor. The control system is more fully described in co-pending U.S. patent application Ser. No. 09/212,002, the entire description of which is herein incorporated by reference.

As shown in FIG. 3, the drive wheel 38 cooperates with the transport device, which in this embodiment is part of the transport pod, to propel and optionally to guide the pod along the path. The drive wheel 38 engages a groove 40, or other suitable surface, formed in the underside of the pod. The groove 40 defines the horizontal plane in which the pod sits on the drive wheels 38. The engagement between the drive wheels 38 and the groove 40 controls lateral or side-to-side movement of the pod as well as vertical movement of the pod. While the combination of the groove 40 and drive wheels 38 is preferred, it is to be understood that the groove 40 may be eliminated entirely provided the transport device, drive rail 32 or idler rail 34 include a guiding device for guiding the pod as it moves along the rails 32, 34. In an alternative embodiment, the idler rail 34 guides the transport device, that is it cooperates with the transport device to constrain movement of the device in both the vertical and lateral directions and in this instance the drive rail 32 would constrain only the vertical movement of the transport device.

The idler rail 34 is parallel to and spaced from the drive rail 32. One or more connectors 44 are mounted to the drive and idler rails 32, 34 to maintain a predetermined spacing between the rails and facilitate installation of the conveyor. The drive rail 32 and connectors 44 may be mounted to a suitable mounting frame or suspended from the ceiling by an overhead frame (not shown), or may be supported directly or indirectly by the process tool. The pod rides along the upper surface of the idler rail 34, with the idler rail 34 cooperating with the transport device to support one side of the transport pod. In the illustrated embodiment, a pad or cushion material 46 is provided along the upper surface of the rail 34 to provide the pod with a smoother ride although if desired the pad 46 may be omitted and the pod may ride directly on the upper surface of the rail 34. Alternatively, a pod, cushion or resilient material may be incorporated into the outer perimeter of the drive wheels. At least one shoe 48 carried by the transport device, here the transport pod, rides along the upper surface of the idler rail 34. The shoe 48 is preferably provided by a wheel, although the shoe may also take other forms including, but not limited to, a fixed support having an anti-friction plastic surface, an air bearing and a magnetic levitation bearing. As the pod is propelled along the conveyor 14, the shoe 48 rides along the idler rail 34 to support the pod in a manner which minimizes bumping, jolting or shimmying of the pod, allowing the pod to be moved in a smooth, controlled manner.

Figure 2B:
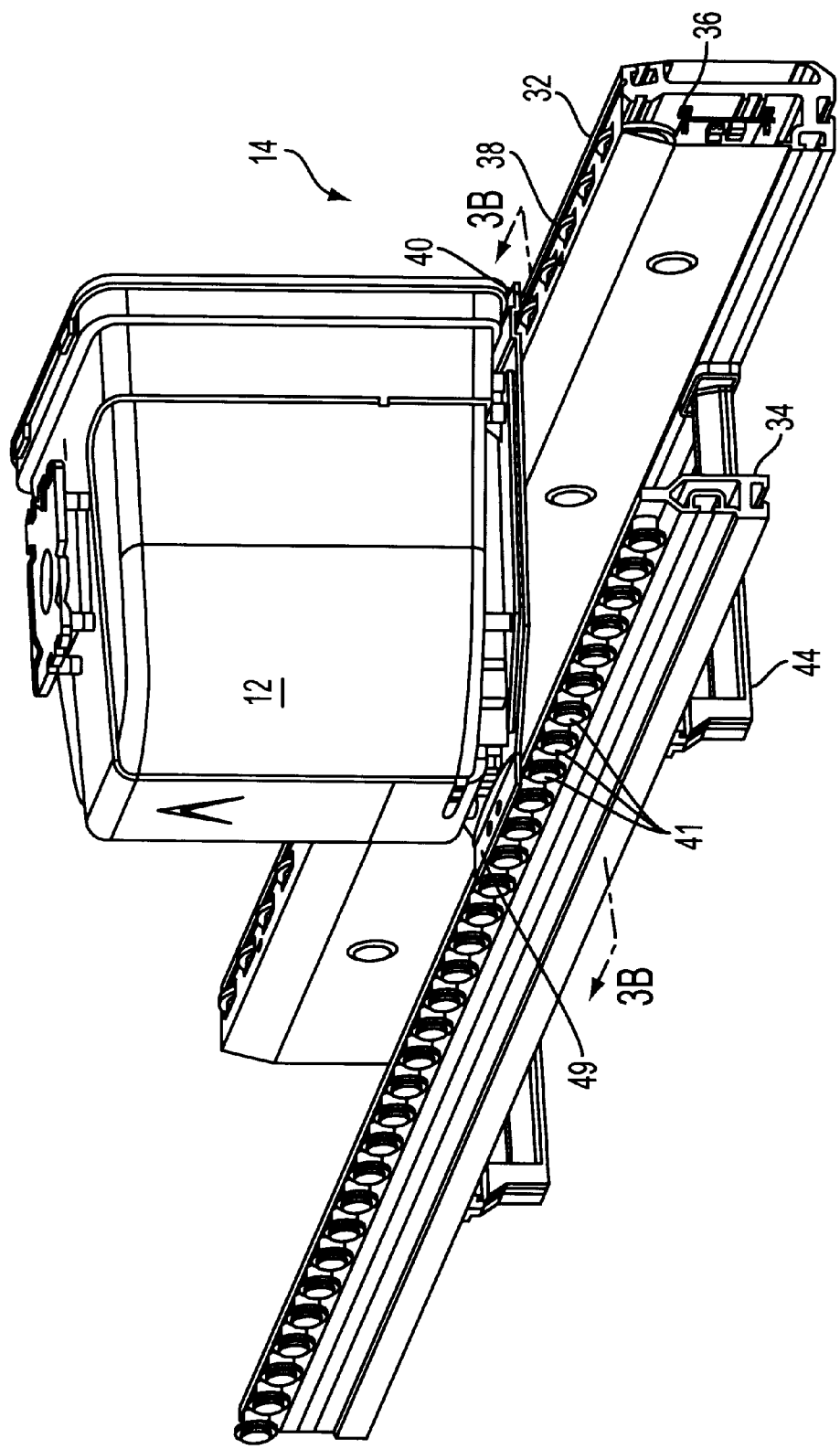
FIG. 2b is a pictorial view of a section of the conveyor system shown in FIG. 1 according to an alternative embodiment of the present invention.
Figure 3A:
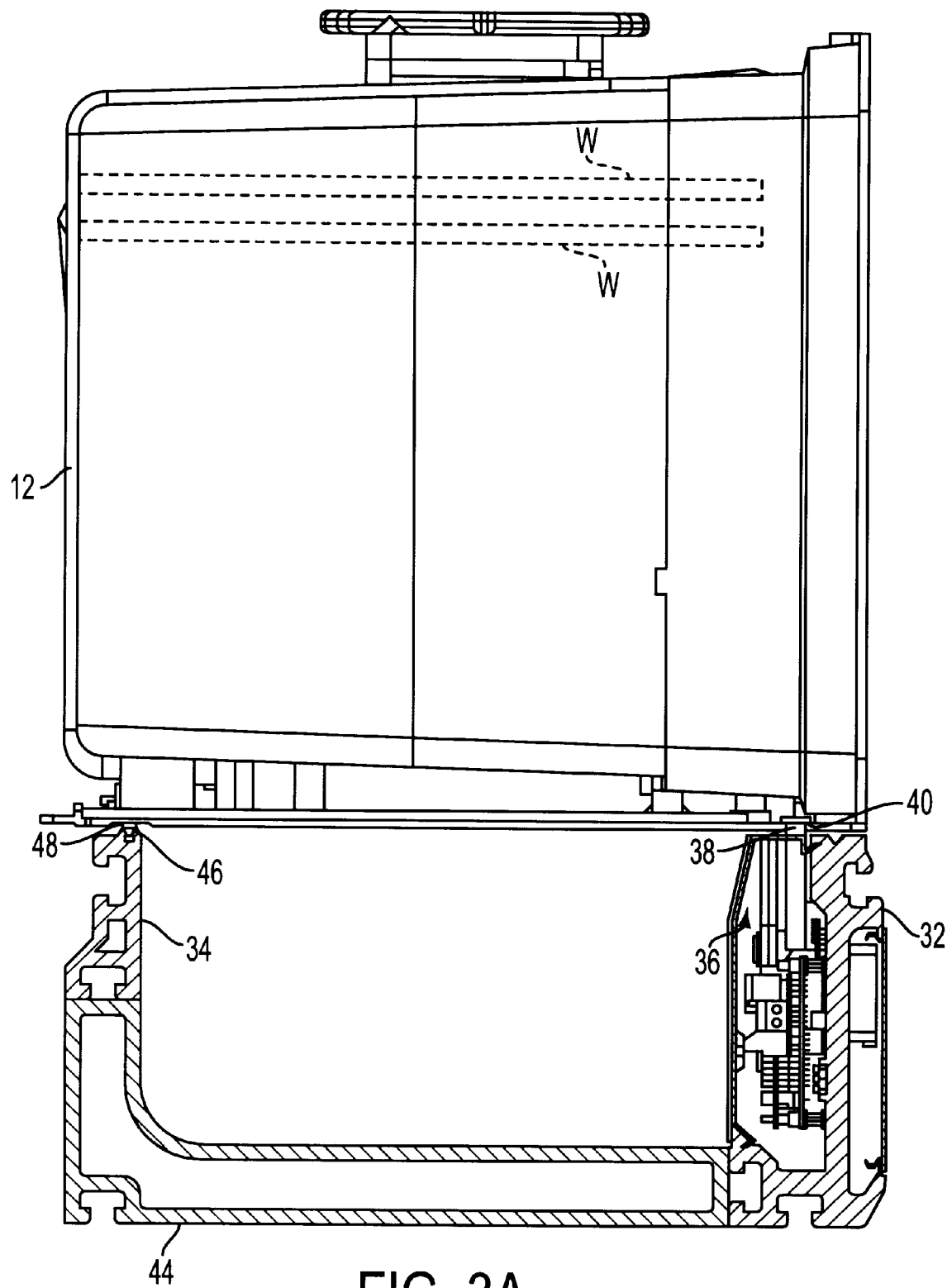
Figure 3B:
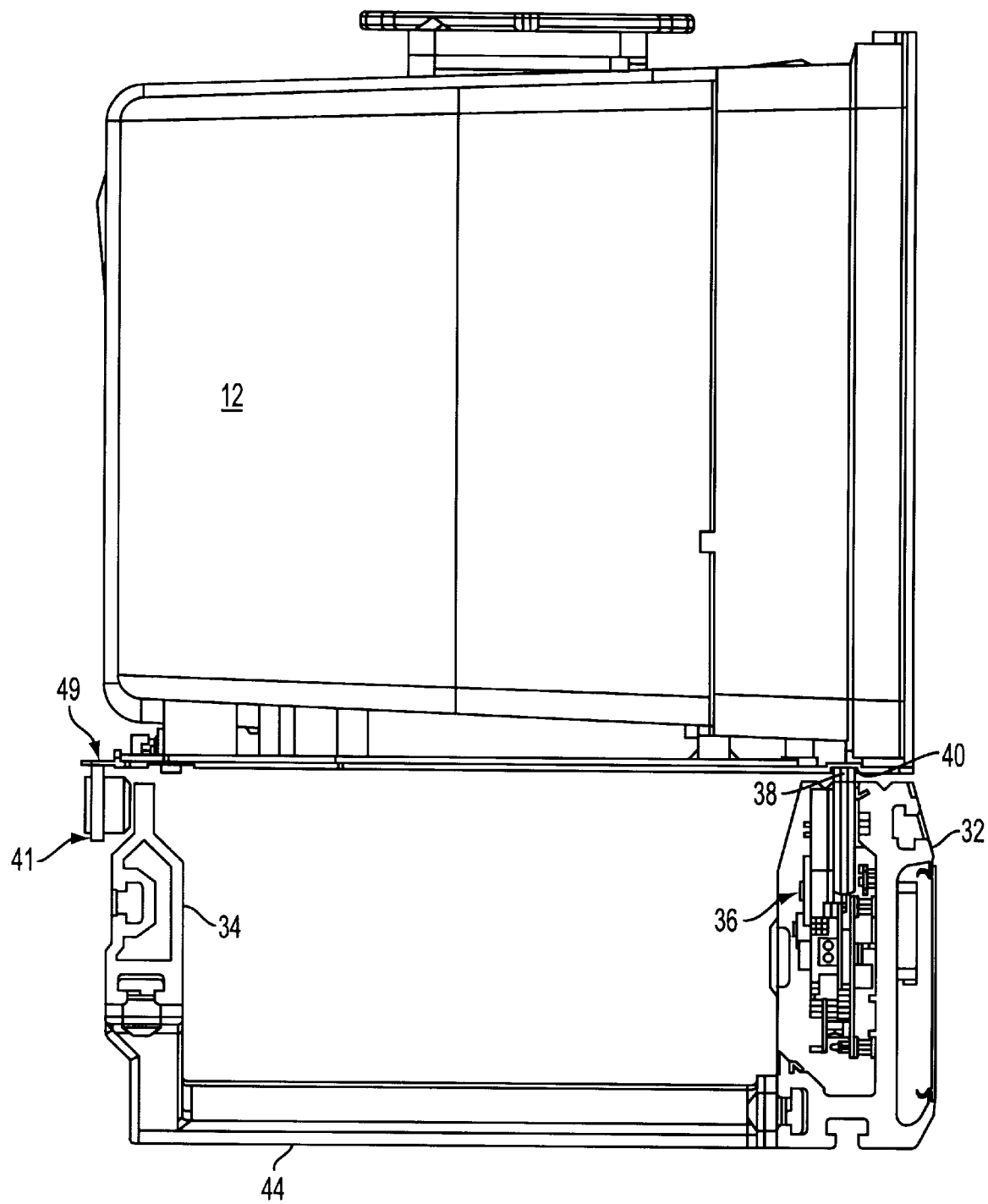
FIG. 3b is a sectional view taken substantially along line 3b—3b of FIG. 2b.

In another alternative embodiment shown in FIGS. 2b and 3b, the shoe 48 is provided by a fixed support 49. In this embodiment, the idler rail 34 includes a plurality of rollers 41 for supporting the fixed support 49. The rollers 41 support the fixed support 49 on the underside of the transport pod as it travels along the idler rail 34. Preferably, the fixed support 49 will have an anti-friction plastic surface. In yet another embodiment, the idler rail 34 provides guidance as well as supporting the transport device. To provide guidance, the shoe 48 or the idler rail 34 includes a guiding device. One example where a guiding device is incorporated into the idler rail is with the use of a v-rail. Alternatively, the shoe may incorporate a guiding device. For example, the shoe 48 may be provided by a fixed support having a groove formed therein (not shown) which engages the rollers 41 on the idler rail 34. It should be understood that while specific embodiments of the shoe are described, the shoe 48 may take many other forms which provide the function of supporting, or supporting and guiding, the transport device.

Although in the preferred embodiment the transfer system 10 is used with the conveyor system 14 of co-pending application Ser. No. 09/103,479, it is to be understood that the transfer system 10 may also be used with other types of conveyors including, but not limited to, other types of parallel rail conveyors, standard roller type conveyors, and the like.

The transport pods 12 are automatically moved from the conveyor 14 to the work station 16 for processing, measuring, and/or simply for storage, and then returned to the conveyor 14 by the transfer system 10. As discussed above, the transfer system 10 is particularly suitable for use in the field of semiconductor processing, but may also be used for other applications within the scope of this invention. In the illustrated embodiment, where the transfer system 10 is used with the conveyor 14, the transport pod 12 must be disengaged from the conveyor; that is, the pod 12 must be sufficiently raised above the drive and idler rails 32, 34 so that the groove 40 clears the drive rail 32 and the shoe 48 clears both the drive and idler rails 32, 34. After the pod 12 is returned to the conveyor, the groove 40 or other suitable surface must seat on the drive wheels 38 and the shoe 48 must seat on the idler rail 34.

Alignment of the pod 12 with the load port 22 also must be precisely controlled. As is known in the art, the load port 22 includes a plurality of kinematic pins 23 (FIG. 4) which engage slots (not shown) on the underside of the transport pod. The use and description of the kinematic pins or couplings used to align transport pod is referenced in certain Semiconductor Equipment and Material International (SEMI®) industrial standards, such as but not limited to SEMI E47.1-0298, SEMI E57-0298, SEMI E15.1-0298 and SEMI E19.4-94, the relevant provisions of which are herein incorporated by reference. Before the transport pod 12 is lowered onto the load port 22, the slots must be carefully aligned with the kinematic pins 23 on the load port. One or more sensors on the conveyor (not shown) verify the accurate placement of the transport pod 12 on the conveyor in a load/unload position for transfer of the pod between the conveyor and load port by the transfer assembly 10. The transfer assembly 10 is described in more detail in relation to FIGS. 4–8.

The transfer system 10 is described in more detail in relation to FIGS. 4–16. The transfer system 10 generally includes a lift or elevator system 60 for lifting the transport pod 12 or other article from the conveyor 14 and a support assembly 62 for supporting the article at the work station. In the illustrated embodiment, the elevator system 60 is positioned below the conveyor 14 between the drive and idler rails 32 and 34 such that the articles pass directly over the elevator system 60 as they are moved along the conveyor 14. However, it is to be understood that the transfer system may include other types of lift systems in accordance with this invention, including lift systems positioned to one side of the conveyor. A hoist-type lift system which engages the top of the article 12 to lift the article from the conveyor 14 may also be employed.

As shown particularly in FIGS. 6–10, the lift or elevator system 60 generally includes at least one support member 64 which supports the article as it is lifted above the conveyor 14. In the illustrated embodiment, the elevator system 60 includes two spaced-apart support members 64 which are positioned to engage the bottom edges of the transport pod or article 12 along the side edges of the pod, providing a substantial gap between the support members 64. The support members 64 include an upward extending lip or flange 65 for preventing the pod from moving off of the support members 64 in the event the pod shifts when carried by the support members. If desired, the height or shape of the lip 65 may be adjusted to provide a greater or lesser amount of protection. While two support members 64 are used in the illustrated embodiment, it is to be understood that a greater or lesser number of support members may be employed in other embodiments of the invention. For example, the elevator system may include four support members shaped and positioned to engage the corners of the transport pod or a single support member. The single support member may have a U-shaped configuration to securely support the article in a stable condition as it is raised above the conveyor or, for very light-weight articles, the single support member may have other shapes and sizes. As discussed below, the support member or members are preferably shaped to cooperate with the support assembly 62 for the efficient transfer of the article from the support members to the support assembly 62.

The support members 64 are carried by a frame body 66 positioned below the drive and idler rails 32 and 34. In this embodiment, the frame body 66 is mounted to support ties 68 secured to the frame structure of the drive and idler rails 32 and 34. However, it is to be understood that other means may be used to secure the frame body 66 to the conveyor 14. Instead of mounting the frame body 66 to the conveyor 14, the conveyor may be secured to the facility floor or to a separate frame structure.

The frame body 66, including a removable cover 67, houses the components of the elevator system 60. As shown particularly in FIGS. 8 and 9, in the illustrated embodiment the frame body 66 the support members 64 are slidably coupled to the side walls 72 of the frame body. The side walls of the frame body 66 define rails for guiding the vertical, linear movement of the support members relative to the frame body 66. A linear slide 74 is coupled to the support member 64 such that the support member 64 is raised and lowered as the slide 74 moved as discussed in more detail below. Instead of the separate rails 72 and slides 74, it is to be understood that in other modifications both support members 64 may be coupled to a common slide-rail assembly. Moreover, the slide-rail assembly may be replaced by other types of systems for producing the vertical, linear movement of the support members 64. Examples of such alternative systems include, but are not limited to, air cylinder lifting devices, pneumatic lifting devices and devices with a scissor-leg configuration.

A drive system 78 controls the vertical movement of the linear slides 74. The drive system 78 includes two lead screws 80, each associated with one of the linear slides 74. The upper and lower ends of the lead screws are coupled to the frame body 66 by bearings 82 for substantially unrestricted rotation of the lead screws 80 relative to the frame body 66. The upper bearing 82 is seated in a bearing cup 83, allowing the height of the cover 67 to be reduced. A motor 84 is coupled to one of the lead screws 80 via a belt 86 and a timing belt pulley 88 which is mounted to a shaft which extends downwardly from the lower end of the lead screw 80. A second timing belt pulley 92 coupled to the first timing belt pulley 88 transmits the drive force to the second lead screw 80 via a second belt 94 and a timing belt pulley 96 mounted to a shaft extending downwardly from the lower end of the second lead screw 80. In the illustrated embodiment, the motor 84 is a stepper motor although it is to be understood that other types of motors may be employed. In addition, other means may be used to transmit the drive force to the lead screws 80. While the motor 84, pulleys 88, 92, 96 and belts 86, 94 are positioned toward the bottom of the frame body 66 and the lower ends of the screws 80, it is to be understood that these components may instead be coupled to the upper ends of the lead screws. Preferably, a magnet (not shown) is placed in timing pulley 96. The magnet rotates past a Hall effect sensor 95 to verify rotation of the screw 80. This allows the detection of a belt failure and verification of rotation.

Figure 8:
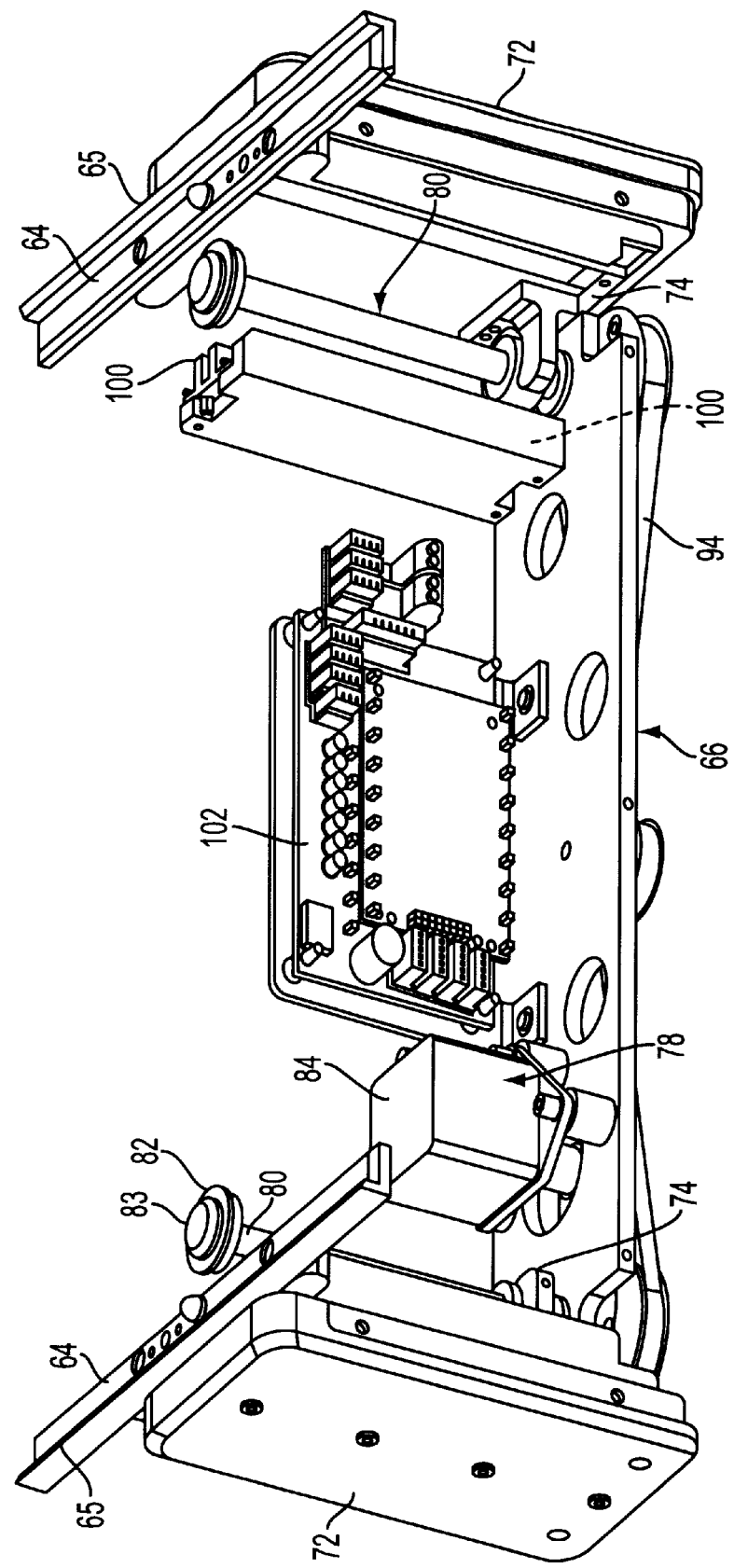
FIGS. 8 and 9 are pictorial views, partially broken away, of the elevator system of FIG. 6.
Figure 9:
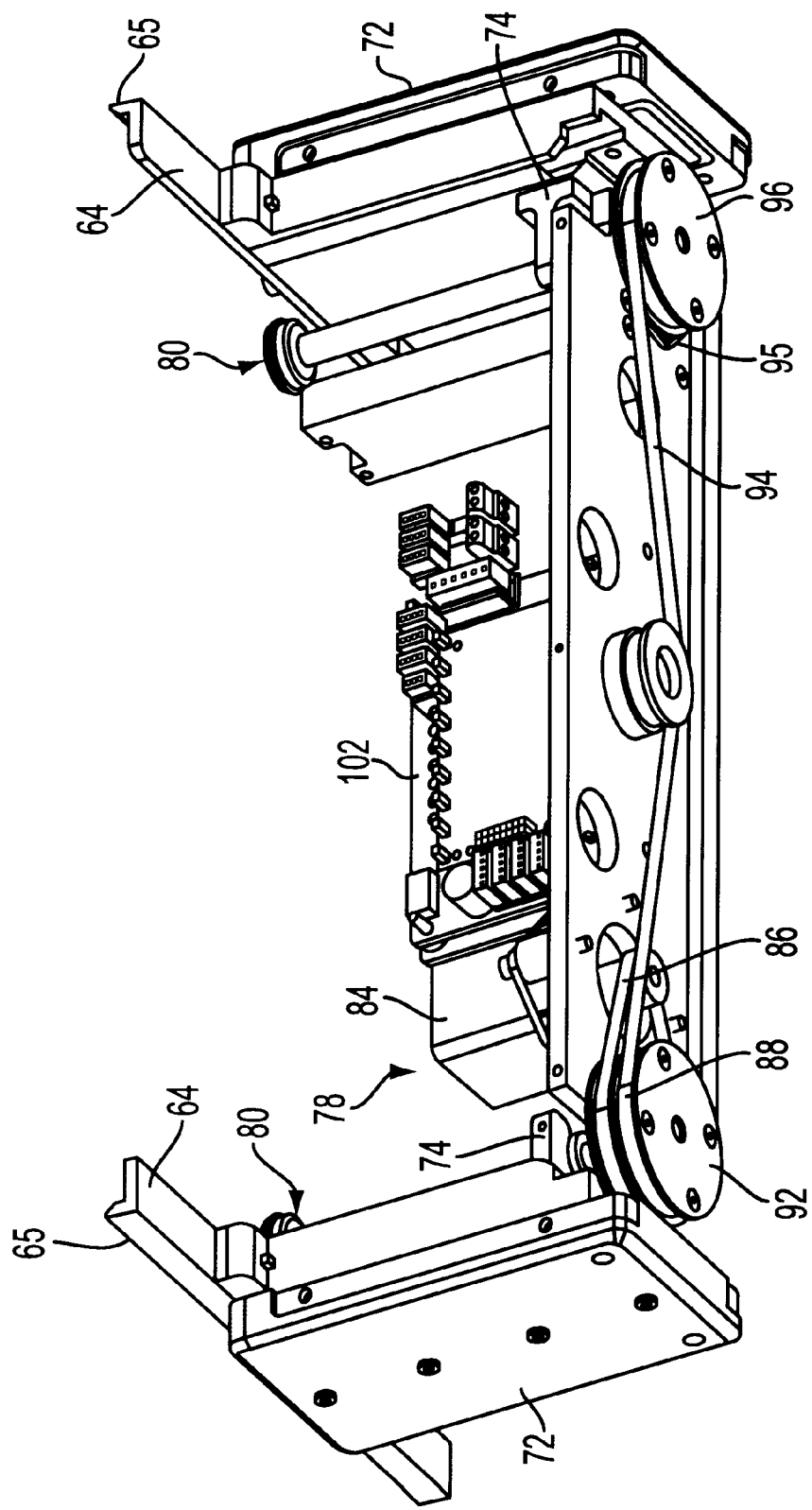
Figure 10:
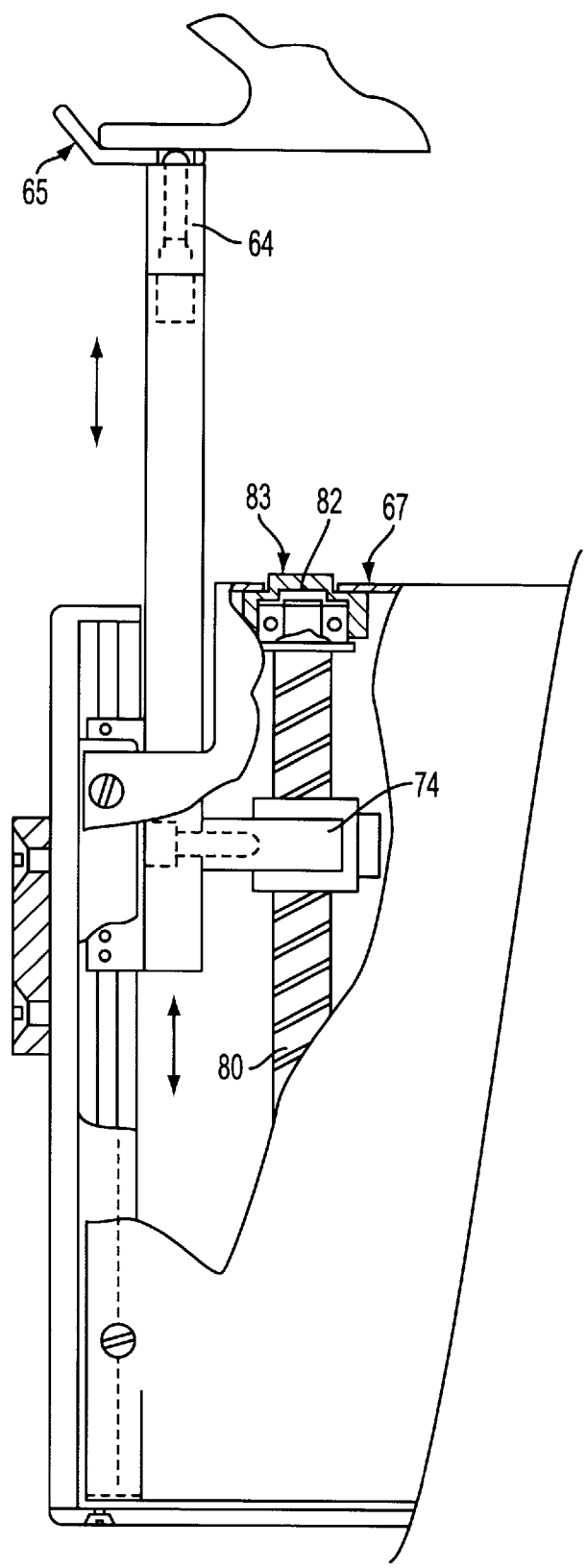
FIG. 10 is a front sectional view, partially broken away, of the elevator system of FIG. 6.
Figure 13:
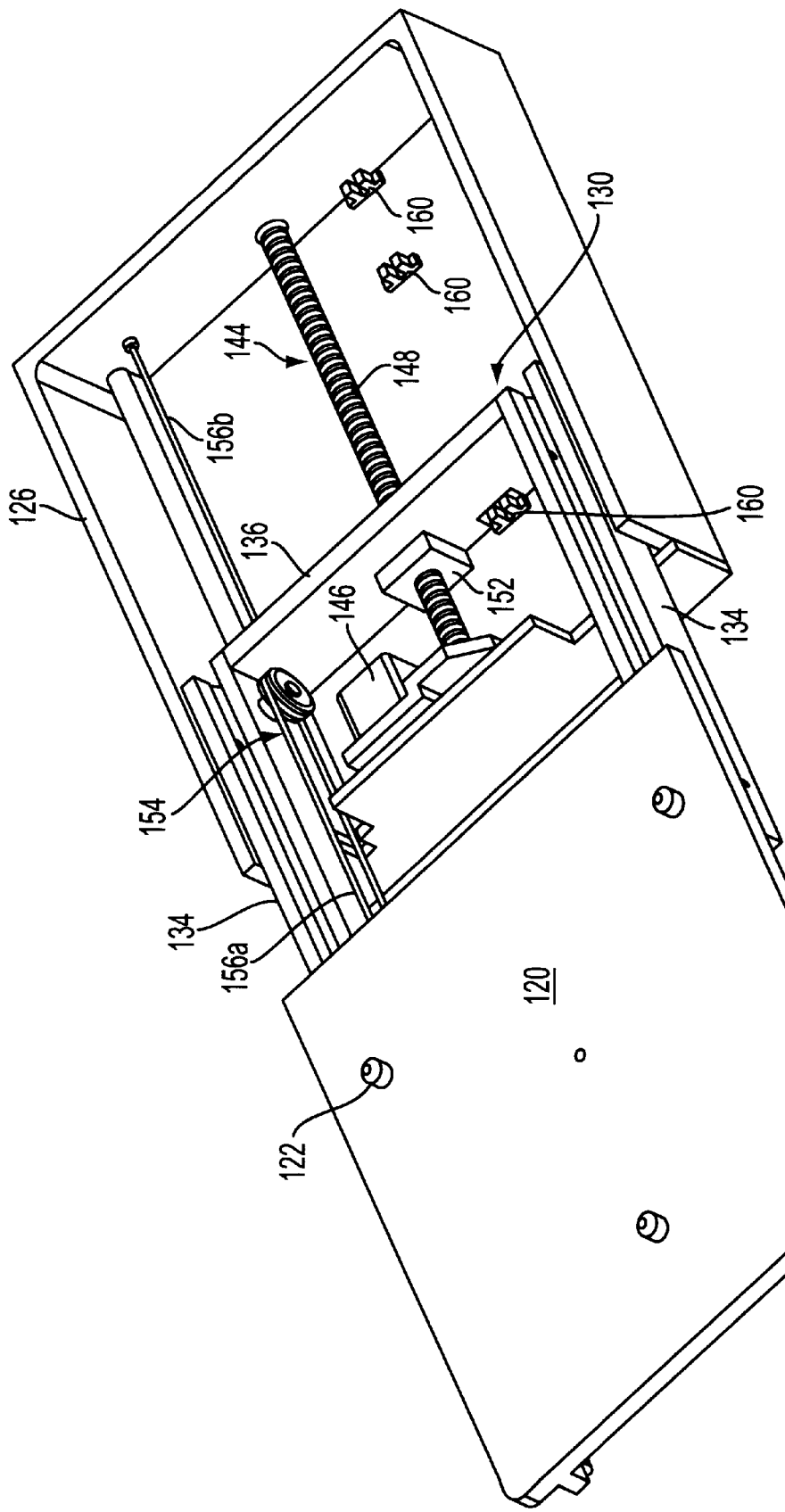
FIG. 13 is a top pictorial view, partially broken away, of the support assembly of FIG. 4, shown with the shelf in an extended position.

The support members 64 are raised and lowered relative to the frame body 66 and the drive and idler rails 32, 34 of the conveyor by activating the motor 84 to rotate the lead screws 80. FIGS. 8 and 9 show the support members 64 in a lowered position where the support members 64 are positioned below the upper surface of the drive and idler rails 32, 34. As the support members 64 are moved upward, they engage the underside of the article as shown in FIG. 10. Continued upward movement of the support members 64 lifts the pod from the conveyor until the pod is sufficiently elevated above the conveyor to permit transfer of the pod to the support assembly 62 as described in more detail below, with the support members 64 bearing the weight of the pod until this transfer is completed. After the pod has been transferred, the support members 64 are preferably lowered below the surface of the conveyor 14 to permit other articles to move past the elevator system. However, if desired the support members 64 may remain in a raised position until the pod is returned to the elevator system 60. After the pod is repositioned on the support members 64, as described below, the motor is activated to lower the slides 74 and the associated support members 64 to thereby deposit the pod on the drive and idler rails 32, 34 for further transport of the pod along the conveyor 14.

Limit switches 100 are used to define the upper and lower boundaries of the slides 74 relative to the associated lead screw. The amount of actual displacement of the slides 74 on the lead screw is determined by the operation of the motor 84, which is controlled by a control system 102. The amount of upward displacement of the support members 64 which is necessary depends in part upon the location of the support members 64 relative to the drive and idler rails 32 and 34. In this embodiment, the support members 64 are positioned just below the surfaces of the drive and idler rails 32 and 34 when the support members are in the lowered positions. The pod may be sufficiently lifted above the surface of the conveyor 14 by raising the support members 3 inches to 5 inches, for example 4 inches. However, it is to be understood that the vertical distance over which the support members 64 are moved is subject to considerable variation.

In the illustrated application, the transfer system 10 is used to move pods filled with one or more semiconductor wafers. In view of the fragile nature of the contents of the pods, sensors are used to determine the proper positioning of the transport pod prior to transfer. In this embodiment of the invention, one or more sensors (not shown) are provided on the conveyor 14 upstream from a location directly opposite the load port 22. The transport pod traveling along the conveyor 14 is stopped at this upstream position. The sensor or sensors detect the presence of a transport pod at this upstream position, and the transport pod is then indexed forward the precise distance between the upstream position and a position directly in front of the load port and directly above the support member. At least one and preferably both of the support members 64 also include sensors 104 for detecting when the support members 64 contact the underside of the transport pod. In this manner, the sensors 104 detect when the pod is properly seated on the support members before the support members 64 lift the pod above the conveyor 14. In the illustrated embodiment, the sensors 104 are optical sensors although other types of sensors may also be employed if desired. Pins 106 carried by the support members 64 engage the underside of the pod 12 for additional stability of the pod 12 on the support members 64. In other applications, such accurate control over the position of the article relative to the support members 64 may not be necessary.

Figure 4:
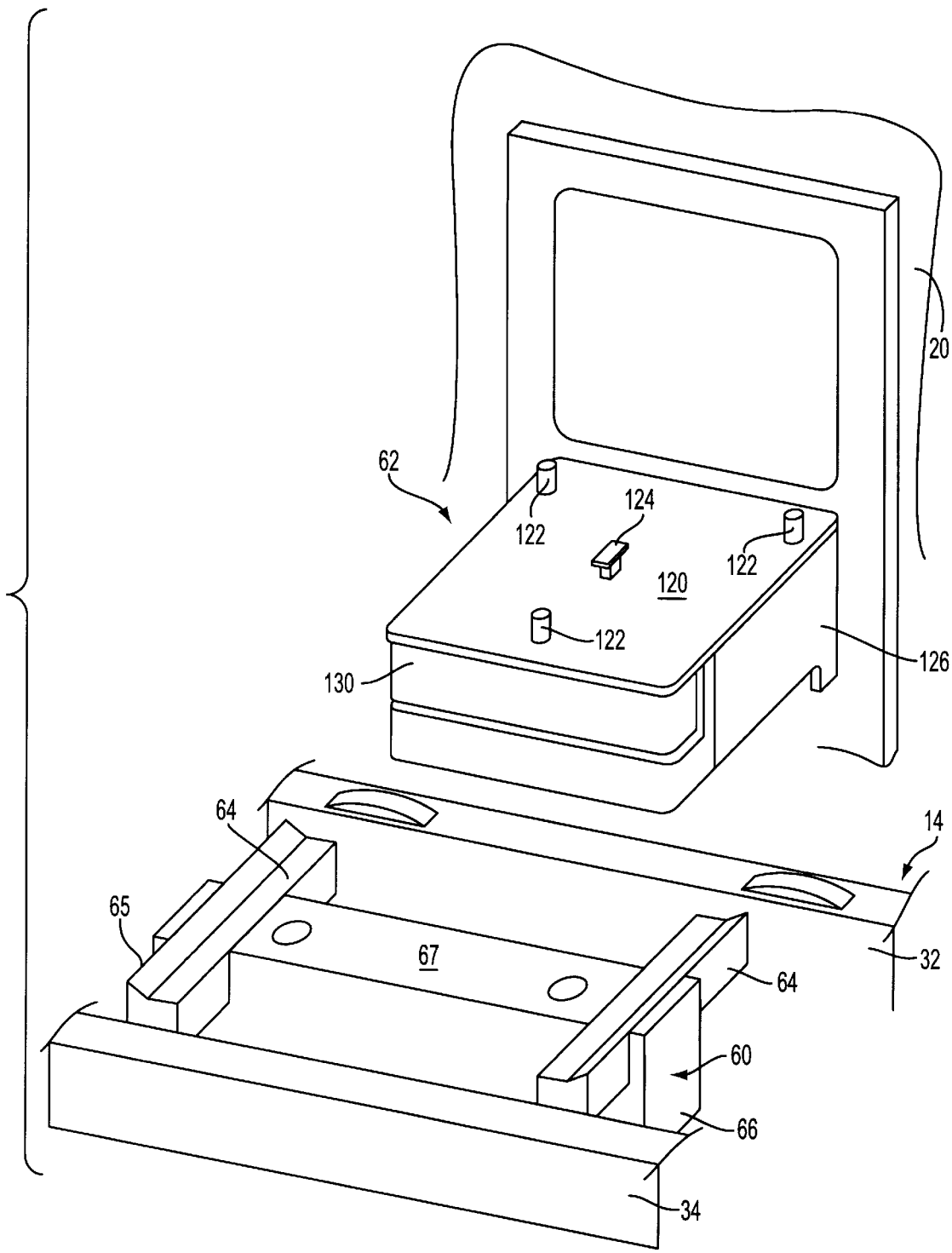
FIG. 4 is a pictorial view of the transfer system of FIG. 1, shown with the lift device in the lowered position and the shelf in the retracted position.
Figure 5:
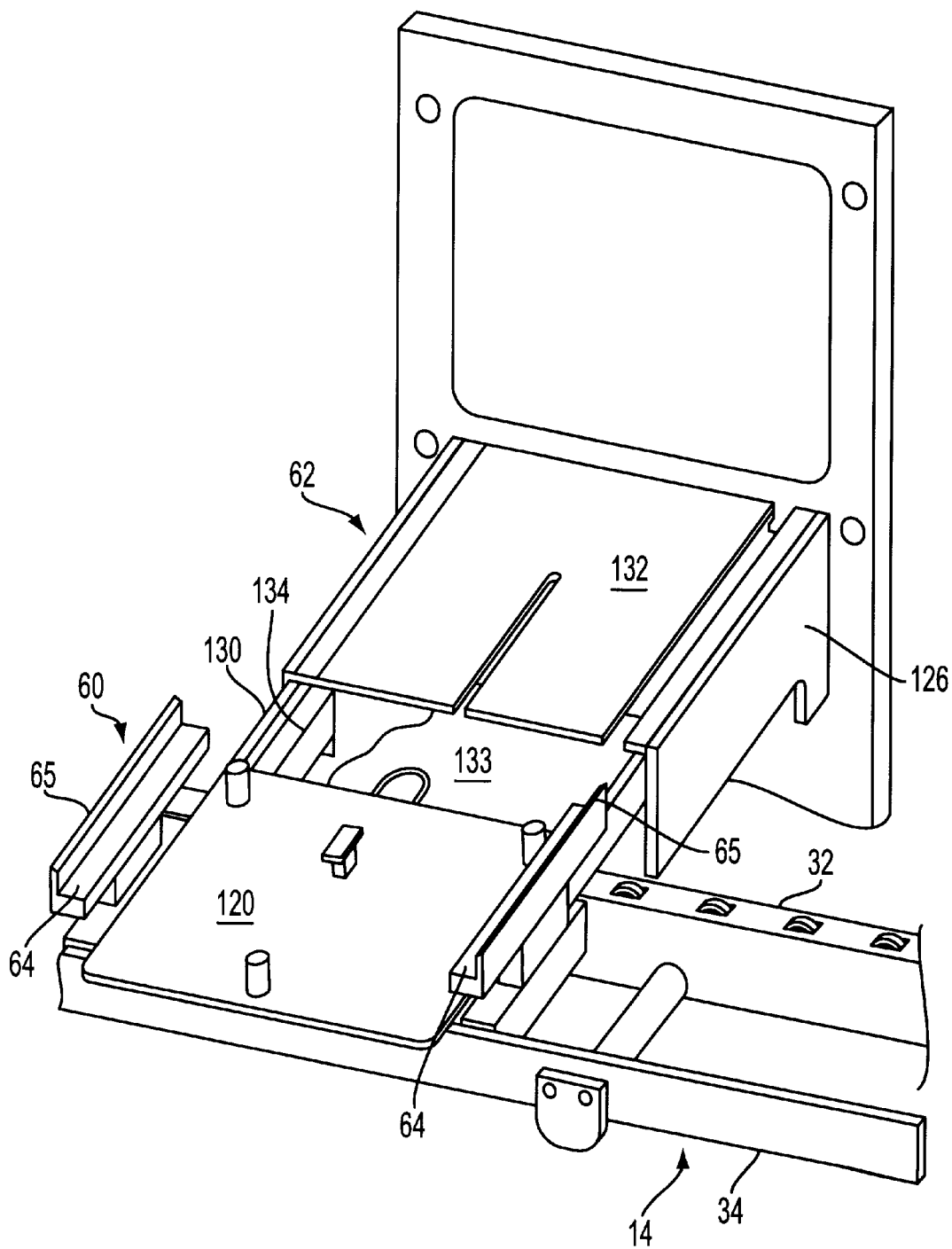
FIG. 5 is a pictorial view of the transfer system of FIG. 4, shown with the lift device in the raised position and the shelf in the extended position.
Figure 6:
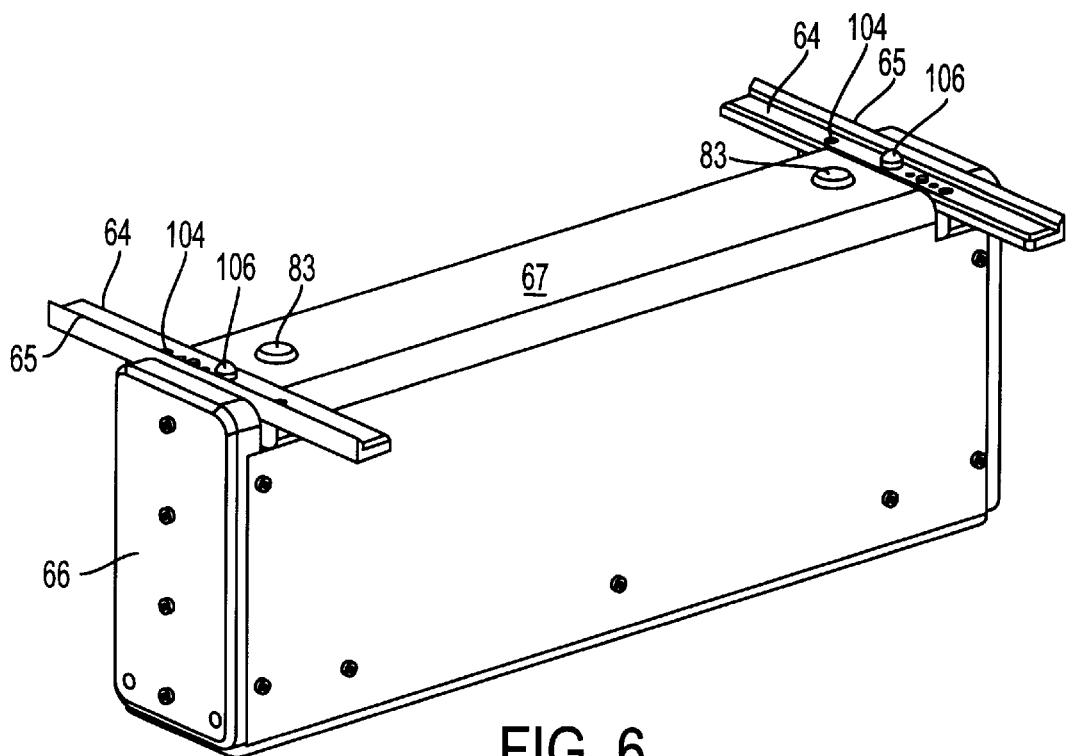
FIG. 6 is a pictorial view of the elevator system of the transfer system of FIG. 4, shown with the lift device in the lowered position.
Figure 7:
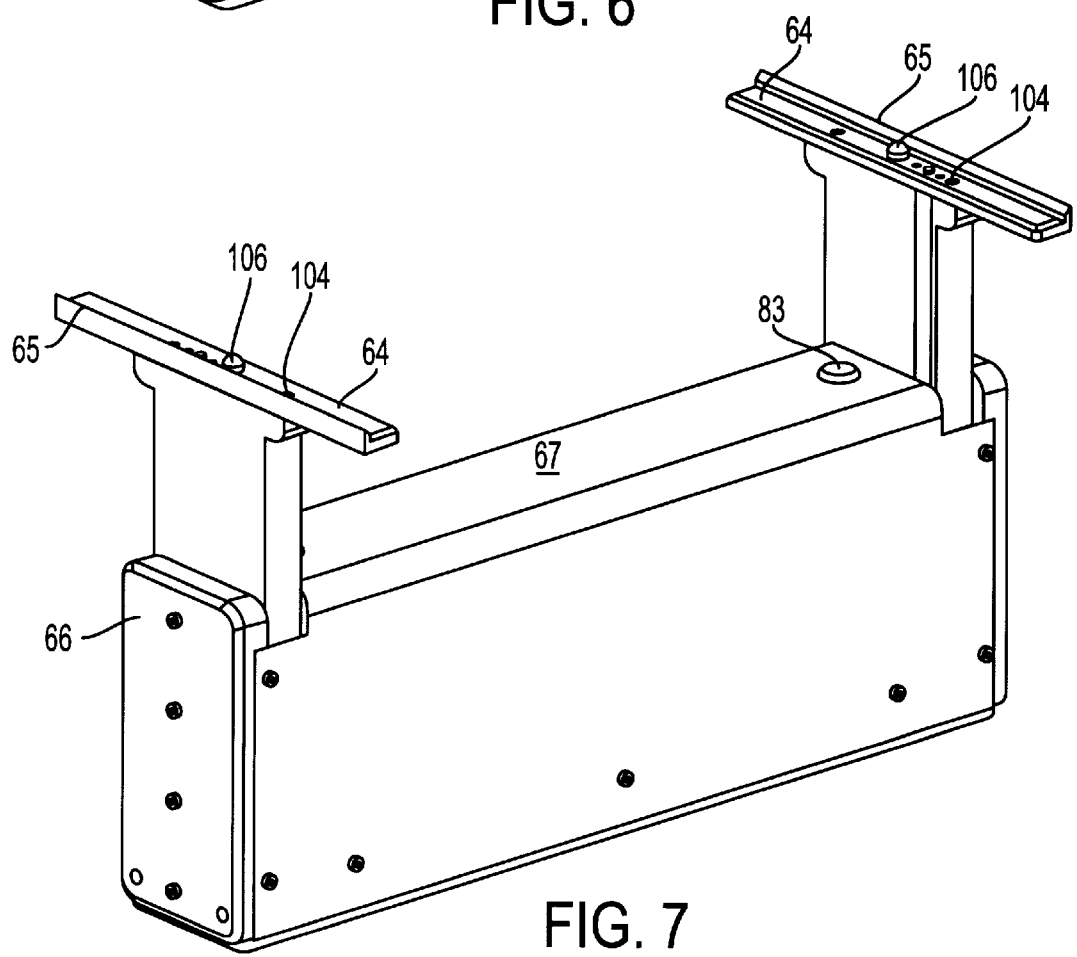
FIG. 7 is a pictorial view of the elevator system of the transfer system of FIG. 4, shown with the lift device in the raised position.

In the illustrated embodiment, as shown in FIGS. 4 and 5, the support assembly 62 is positioned at the work station. In the illustrated application, where the conveyor 14 and transfer system 10 are used in the field of semiconductor processing, the support assembly 62 is mounted to the processing machine adjacent the door or port of the machine. This arrangement facilitates the movement of the pod into sealing engagement with the load port seal to preserve the clean interior environments of the transport pod and the processing machine. However, it is to be understood that the support assembly 62 may also be mounted to a frame positioned directly in front of the processing machine.

Turning to FIGS. 11–15, the support assembly 62 generally includes a shelf member or support member 120 for supporting the article. In the illustrated embodiment, where the transfer system 10 is used for semiconductor processing, the shelf 120 includes a plurality of upward-projecting retainers 122, commonly referred to as kinematic pins, which cooperate with the kinematic slots on the underside of the transport pod to ensure the accurate positioning of the pod relative to the load port seal. An additional retainer 124 is provided for increased stability as the pod is moved between the conveyor 14 and the processing machine 20.

The shelf 120 is coupled to a frame body 126 such that the shelf 120 slides between a closed position (FIGS. 4 and 11), with the shelf 120 positioned adjacent the processing machine 20, and an open or extended position (FIGS. 5 and 12), with the shelf 120 laterally supported from the frame body 126 such that the shelf 120 is positioned above the conveyor 14. In the illustrated embodiment, the total travel distance of the shelf 120 is about 16 inches to 20 inches, for example 18 inches. However, it is to be understood that the total travel distance may be increased or decreased depending upon the position of the conveyor relative to the processing machine. In the load port systems employed in the prior art, some shifting of the load port relative to the processing machine is provided to urge the pod against the load port seal and ensure an adequate seal is obtained before the doors of the transport pod are opened. This horizontal shifting of the prior art load ports is different from the movement obtained with the support assembly 62 of the present invention, where the load port must traverse the distance between the load port and conveyor 14, carrying the entire weight of the pod between the conveyor 14 and processing machine 20.

The shelf 120 is coupled to a movable carriage 130 which is carried by the frame body 126 and is moved between the closed and extended positions by the movable carriage 130. The movable carriage 130 is positioned below a fixed upper shield plate 132 of the frame body 126. The shield plate 132 protects the interior components of the support system 62 and provides a smooth surface across which the shield plate 132 may be moved. The interior components of the movable carriage 130 are covered by a second shield plate 133 which also provides the carriage 130 with increased racking stiffness. The carriage 130 includes a pair of spaced-apart telescoping slides 134 mounted to a back plate 136 of the carriage 130. In the illustrated embodiment, each slide 134 includes a plurality of ball bushings 138 (FIG. 15) to facilitate the extension and retraction of the slides.

Figure 14:
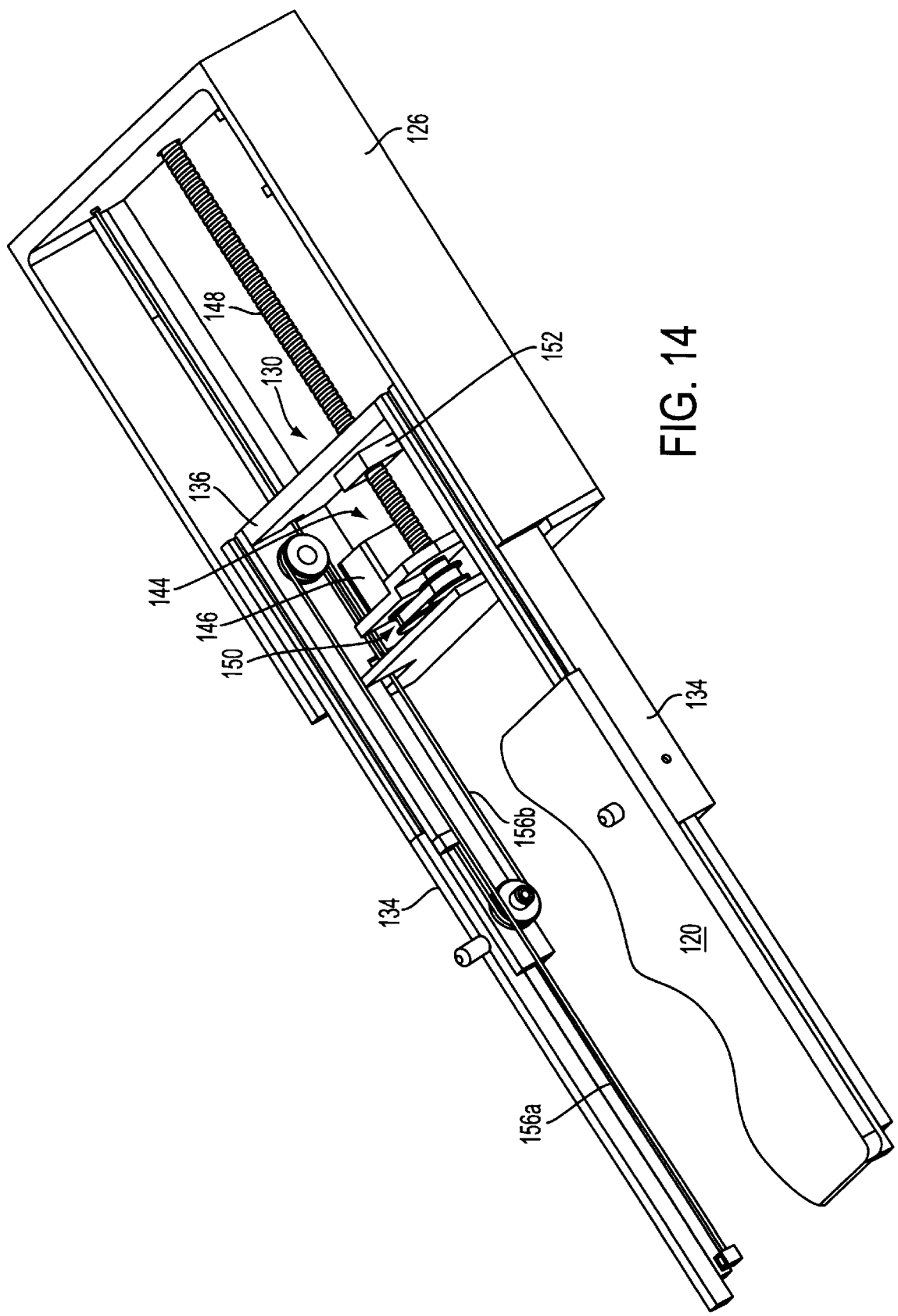
FIG. 14 is a pictorial view, partially broken away, of the support assembly of FIG. 4.
Figure 15:
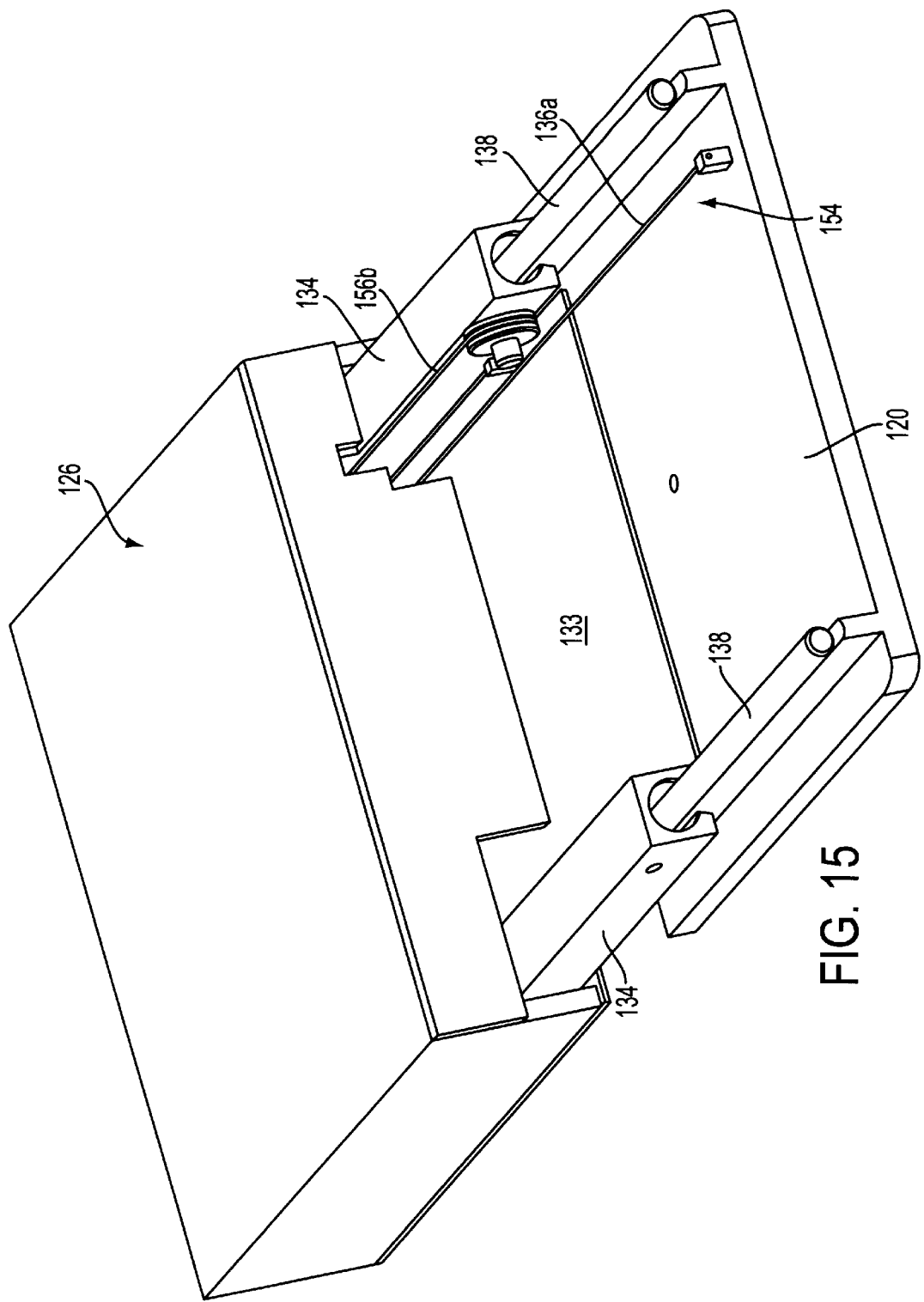
FIG. 15 is a bottom pictorial view of the support assembly of FIG. 4, shown with the shelf in an extended position.

The movement of the carriage 130 is controlled by a drive system 144 carried by the frame body. In the illustrated embodiment, the drive system 144 includes a motor 146 mounted to the frame body. The motor 146 is coupled to a lead screw 148 via a belt assembly 150 (FIG. 14). The lead screw 148 passes through and is coupled to the back plate 136 by a nut 152. The opposite ends of the lead screw 148 are mounted to the frame body 126 by ball bearings (not shown). The motor may be operated in forward or reverse, with one being used to move the back plate 136 in a forward direction and extend the slides 134 and the other being used to move the back plate 136 toward the back of the frame body 126 to retract the slides 134 and move the shelf 120 to the closed position. When the plate is moved toward the front end of the frame body 126, the forward motion of the back plate 136 and the operation of the ball bushings cause the slides 134 to be extended and the shelf 120 to move to the extended position. The cable assembly 154 facilitates extension of the shelf 120 as well as retraction of the slides 134 to move the shelf 120 to the closed position. In the illustrated embodiment, two cables 156a and 156b are provided for each slide. It is to be understood that other means may be used instead of or in addition to the cable assembly 154 to retract the slides 134 into the frame body 126.

The actuation of the motor 146 is controlled by a control system (not shown). Preferably, the control system communicates with the control system 102 of the elevator system 60. The support system 62 also includes a limit switches 160 which may be used to monitor the movement of the back plate 136 and detect when the shelf 120 has been moved to the fully extended position.

Figure 16:
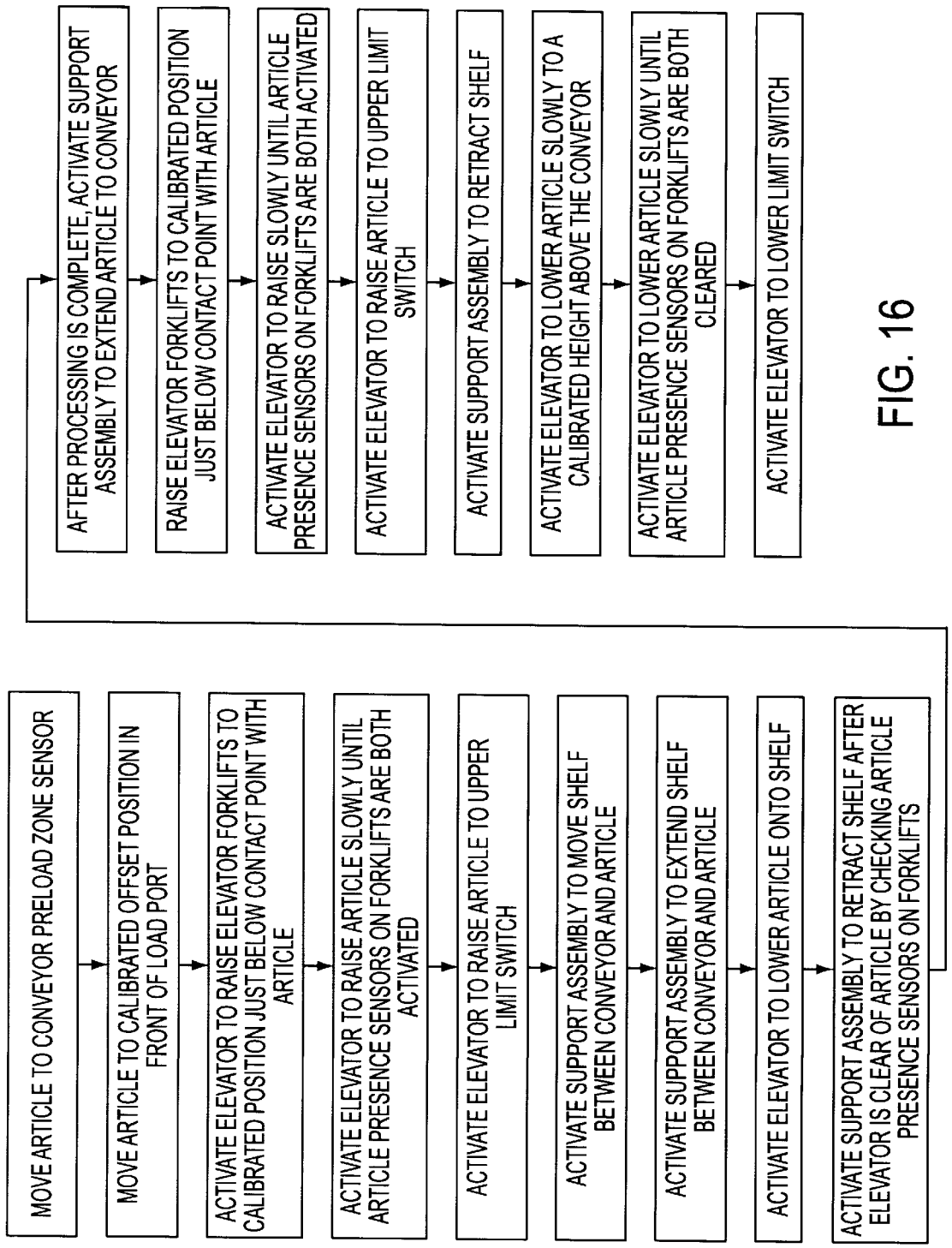
FIG. 16 is a flow chart showing the sequence of operation of the transfer system of this invention.

FIG. 16 schematically illustrates the operation of the transfer system 10. A transport pod or other article is transported along the conveyor 14 and positioned at the proper location. The precise control obtained with the drive system 36 of the conveyor 14 allows the pod 12 to be accurately placed at the proper position with minimal impact on the pod or its contents. However, it is to be understood that the transfer system of this invention may be used with other conveyor systems which rely on other means to stop the pod in front of the support system. As discussed above, in this embodiment of the invention the article is initially positioned at a position upstream of the support system 62. The preload zone sensor detects the proper placement of the transport pod 12 at this location. The transport pod 12 is then indexed forward a predetermined distance to position the pod 12 directly in front of the load port.

Once the pod has been delivered to the proper load position, the control system 102 actuates the elevator 60 to lift the transport pod 12 above the conveyor 12. This is accomplished by actuating the drive system 78 to raise the slides 74 to a predetermined position just below the transport pod 12. The slides 74 are slowly raised until they contact the underside of the transport pod 12. Once the proper seating of the transport pod 12 on the support members 64 is detected by the sensors 104, the slides 74 continue to lift the support members until the transport pod 12 is moved to the elevated position. In this embodiment, the fully elevated position is determined by the upper limit switch. As discussed above, in this application the elevator system 60 raises the pod 12 about 3 inches to 5 inches above the upper surface of the conveyor 14, for example 4 inches, although this distance may be increased or decreased if desired. Once the pod has been lifted to the desired elevation, the drive system 78 is deactivated and the pod held in place by the support members 64. The control system 102 sends a signal to the control system of the support system 62 indicating that the pod 12 has been moved to the elevated position.

Once the control system of the support system 62 receives a signal indicating that the pod 12 has been lifted to the elevated position, the drive system 144 is activated to extend the carriage 130 from the frame body 126, thereby moving the shelf 120 between the underside of the transport pod 12 and the conveyor 14. Thus, the minimum elevation of the pod above the conveyor is determined in part by the height of the shelf 120. Once the shelf 120 is fully extended, the kinematic pins 122 are substantially aligned with the kinematic slots (not shown) on the underside of the transport device. The control system of the support system 62 sends a signal to the control system 102 indicating that the shelf 120 is in the fully extended position.

When the control system 102 of the elevator system receives the signal from the control system, the drive system 78 is actuated to lower the slides 74 until the support members 64 deposit the pod 12 on the shelf 120. In the illustrated embodiment, the downward movement of the slides 74 continues until the support members 64 are moved below the upper surfaces of the drive and idler rails 32, 34 so that the elevator system will not obstruct the passage of other pods along the conveyor 14. This feature is of particular advantage where the processing line includes duplicate machines. However, if each pod must be delivered to each machine in turn, the support members 64 may remain above the surface of the conveyor 14 to reduce the amount of time required to complete the transfer of the pod from the shelf 120 to the support members 64.

The sensors 104 detect the absence of the pod 12 on the support members 64 after the pod has been deposited on the shelf. The control system actuates the drive system 144 to retract the carriage 130 and move the shelf 120 to the closed position, with the shelf located directly above the frame body 120. The support assembly 62 then shifts the pod 12 against the load port seal and the wafers are extracted from the pod for processing as is known in the art.

Once processing of the contents of the pod have been completed, the process is reversed to return the pod 12 to the conveyor. Specifically, the drive system 144 is actuated to move the shelf 120 to the extended position above the conveyor 12. Next, the elevator system 60 is activated to raise the support members 64 to a predetermined position just below the transport pod 12. The elevator system 60 then slowly raises the support members 64 until the members 64 contact the underside of the pod 12. Once the sensors detect the proper placement of the pod on the support members 64, the support members 64 are raised to lift the pod from the shelf 120. In the illustrated embodiment, the slides 74 are raised until they reach the upper limit switch. The shelf 120 is then retracted, and the support members 64 lowered to a predetermined position just above the level of the conveyor. The support members 64 are then lowered slowly until the transport pod 12 is deposited on the conveyor. When the sensors 104 detect that the pod is no longer in contact with the support members 64, the elevator lowers the support members 64 to the fully retracted position.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the Claims appended hereto and their equivalents.

What is claimed is:

1. A transfer system for moving at least one article between a conveyor having a first rail and a second rail, and a process station, comprising:

an elevator system positioned between the first and second rail of the conveyor, having a lift device configured to engage a bottom surface of the article, said lift device providing motion between a stand-by position where an article traveling along the conveyor may pass over said lift device, and an actuated position where said lift device raises the article to a predetermined position located above the conveyor; and a support assembly for transporting the article between said predetermined position located above the conveyor and a position proximate to the process station.

2. The transfer system of claim 1 in which said lift device includes spaced-apart support members to support the article as the article is lifted above the conveyor.

3. The transfer system of claim 2 in which each said support member includes at least one flange extending upwardly from each said support member for preventing the article from moving off said lift device.

4. The transfer system of claim 1 in which said lift device includes a plurality of pins configured to engage receptacle features located on the bottom surface of the article.

5. The transfer system of claim 1 in which said elevator system includes at least one sensor for detecting when the article contacts said elevator system.

6. The transfer system of claim 1 in which said support assembly includes a frame body, and a shelf member for supporting the article slidably mounted to said frame body, said shelf member providing linear motion between said predetermined position located above the conveyor and said position proximate to said process station.

7. The transfer system of claim 6 in which said shelf member includes at least one retainer configured to engage the bottom surface of the article when the article is placed on said shelf member.

8. The transfer system of claim 6, wherein said frame body is mounted to the process station.

9. A transfer system for moving articles between a conveyor having a first and second rail spaced-apart and substantially parallel to each other, and a process station, comprising:

a lift system positioned between the first and second rail of the conveyor, including a support member for supporting the article, and a drive assembly for moving said support member between a lowered position located below the first and second rail, and a predetermined raised position located above the conveyor; and a support assembly, including a frame body mounted to the processing station, and a support member slidably mounted to said frame body for supporting the article, said support member provides linear motion between a first position proximate to the processing station, and a second position proximate to said predetermined raised position of said support member.

* * * * *